US006938237B1

(12) United States Patent  
El-Ghoroury

(10) Patent No.: US 6,938,237 B1  
(45) Date of Patent: Aug. 30, 2005

(54) METHOD, APPARATUS, AND SYSTEM FOR HARDWARE DESIGN AND SYNTHESIS

(75) Inventor: Hassan N. El-Ghoroury, Cardiff, CA (US)

(73) Assignee: Ellipsis Digital Systems, Inc., Carlsbad, CA (US)

( * ) Notice: Subject to any disclaimer, the term of this patent is extended or adjusted under 35 U.S.C. 154(b) by 563 days.

(21) Appl. No.: 10/184,799

(22) Filed: Jun. 28, 2002

Related U.S. Application Data

(60) Provisional application No. 60/301,956, filed on Jun. 29, 2001.

(51) Int. Cl.[7] .............................................. G06F 17/50

(52) U.S. Cl. .................... 716/18; 716/6; 716/8; 703/16

(58) Field of Search ...................... 716/6, 8, 18; 703/16

(56) References Cited

U.S. PATENT DOCUMENTS

| | | |
|---|---|---|
| 5,623,684 A | 4/1997 | El-Ghoroury et al. |
| 5,867,400 A | 2/1999 | El-Ghoroury et al. |

OTHER PUBLICATIONS

Liu, J., et al., "Interoperation of heterogeneous cad tools in Ptolemy II", 2001. Journal of Modeling and Simulation of Microsystems, vol. 2, pp. 1-10.*
Edwards, S., et al., "Design of embedded systems: formal models, validation, and synthesis", Mar. 1997. IEEE. pp. 366-390.*
Pino, Jose Luis, et al., "Interface synthesis in hetergeneous system-level DSP design tools", May 1996. IEEE. pp. 1-4.*
IEEE, "IEEE Standard VHDL synthesis packages", 1997, IEEE. pp. 1-43.*
Lee, Edward, "Design methodology for DSP", 1998. Department of Electrical Engineering and Computer Science, University of California, Berkeley. pp. 1-4.*
Hamada, N., et al., "VLSI logic design with logic programming and knowledge-base technlogy" Feb. 1990. IEEE. pp. 1-5.*
Guerra, L, et al., "Behavioral-level synthesis of heterogeneuous BISR reconfigurable ASIC's". Mar. 1988. IEEE. pp. 158-167.*
Kim, Yong Jae, et al., "A heterogeneous simulation framework based on the devs bus and the high level architecture". 1998. Proceedings of the 1998 Winter simulation conference. pp. 421-428.*
Joseph Buck, et al., "Ptolemy: A Framework for Simulating and Prototyping Heterogeneous Systems", Aug. 31, 1992, pp 1-34, Department of Electrical Engineering and Computer Science University of California, Berkley, California 94720.
Karl Van Rompaey, et al., "CoWare—A desgin environment for hetergeneous hardware/software systems", IMEC, Kapeldreef 75, B-3001, Heverlee, Belgium.

* cited by examiner

*Primary Examiner*—Stacy A. Whitmore
(74) *Attorney, Agent, or Firm*—Blakely, Sokoloff, Taylor & Zafman LLP

(57) ABSTRACT

According to one embodiment of the present invention, a method and system for VLSI hardware design and synthesis is provided in which components provided by a heterogeneous modeling framework are interconnected, based on design specifications of a VLSI, to create a corresponding behavioral VLSI model. The heterogeneous modeling framework contains a first component library including logic functions that can be used to build hardware structural models and a second component library including numeric standard. The created model is simulated, tested, and functionally verified using discrete event domain simulation capabilities provided by the heterogeneous framework. A corresponding structural model is extracted from the tested behavioral VLSI model using a software tool provided by the heterogeneous modeling framework.

33 Claims, 3 Drawing Sheets

METHOD, APPARATUS, AND SYSTEM FOR HARDWARE DESIGN AND SYNTHESIS

RELATED APPLICATIONS

This application claims the benefit of U.S. Provisional Patent Application No. 60/301,956 filed on Jun. 29, 2001.

BACKGROUND OF THE INVENTION

1. Field of the Invention

The present invention relates to the field of hardware design and synthesis. More specifically, the present invention relates to a method, apparatus, and system for hardware design and synthesis using a heterogeneous modeling framework.

2. General Background

In recent years, VLSI Hardware Design and Synthesis has been made possible using the Hardware Design Languages (HDL), such as VHDL and VERILOG. HDL languages provide the hardware designer with the following abilities:

Design Entry: Design Entry is the first step taken when a circuit concept is to be realized using computer-aided design tools. Using HDL, Design entry is very much like software design using any high order programming languages. It should be noted that design entry in current HDL-based approaches is non-visual. Current state-of-the-art HDL tools do not allow for Visual Design entry similar to common schematic entry tools such "AUTOCAD".

Behavior Description: Features of HDL allow electrical aspects of the circuit behavior (such as rise and fall times of signals, delays through gates, and functional operation) to be precisely described. The resulting HDL simulation models can then be used as building blocks in larger circuits (using schematics, block diagrams or system-level HDL descriptions) for the purpose of simulation. When creating a behavioral description of a circuit, HDL allows the designer to describe the circuit in terms of its operation over time.

Design Simulation: HDL provides the designer with the ability to simulate the design. Executing HDL models (programs) result in discrete event simulations of the digital circuits that are being designed.

Structure Description: HDL allows the designer to describe the circuit in terms of its components. Structure can be used to create a very low-level description of a circuit (such as a gate-level or transistor-level description) or a very high-level description (such as a block diagram).

While using hardware design languages such as HDL for VLSI hardware design and synthesis has gained popularity, such approaches still have several shortcomings some of which are list below:

Hardware Design Languages are advanced high order programming languages. They require thorough knowledge and experience in programming techniques and languages. This adds the burden requiring that VLSI hardware designer to be an established programmer who is familiar with advanced programming topics such as Object Oriented programming, Structured Programming, Strong Data Typing, and Component-based Design techniques.

In most VLSI ASIC applications, such as Digital Communication Systems, the algorithms to be implemented in VLSI hardware are initially developed in C, C++, or Java. The syntax of most HDL languages is different than C, C++ or Java. This means that these algorithms have be hand translated by the hardware designer into HDL. Adding yet another burden on the designer not only to learn HDL, but also to be capable of understanding C, C++ or Java.

HDL simulation capabilities are limited to discrete event simulation of digital logic. This is too restrictive in trying to build current VLSI ASIC designs containing mixed signal and analog components. The designer has to use other system modeling techniques (such SMULINK or SPICE) to describe parts of the circuit that are not digital. Adding yet another burden on the hardware designer to acquire and learn other modeling and simulation tools.

State of the art tools in HDL design entry are non-visual, expensive, and have restricted portability to other platforms. Furthermore HDL structural model simulation requires expensive special hardware accelerators.

Accordingly, there exists a need for a method and system for performing hardware design and synthesis that alleviate the aforementioned shortcomings and provide more versatility to increase the hardware designer productivity.

DETAILED DESCRIPTION OF THE INVENTION

This invention relates to a method, apparatus, and system for visual hardware design and synthesis using a heterogeneous modeling framework. In one embodiment, as described in details below, enhanced versions of heterogeneous modeling tools such as the Java-based Ptolemy developed by the University of California at Berkeley are utilized for performing hardware design and synthesis in accordance with the teachings of the present invention.

Figure 1:
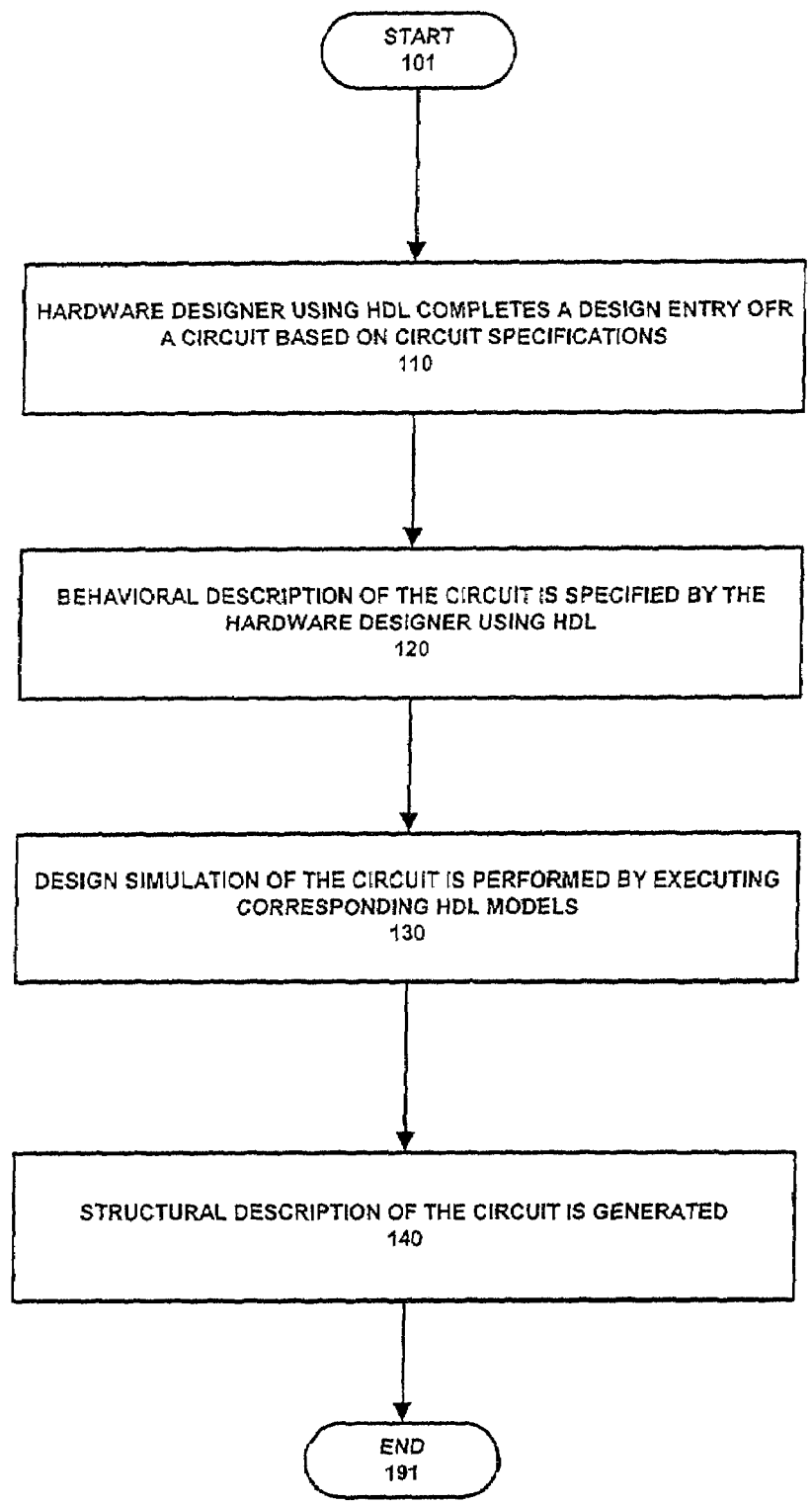
FIG. 1 illustrates an exemplary process for hardware design using a conventional hardware design language (HDL) such as VHDL or VERILOG.

FIG. 1 illustrates an exemplary process for hardware design using a conventional hardware design language (HDL) such as VHDL or VERILOG. At block 110, using HDL, a hardware designer completes a design entry for a circuit based on circuit specifications. As mentioned above, design entry is typically the first step taken to realize a circuit concept using computer-aided design tools. Design entry is similar to software design using high order programming languages. Again, it should be noted that design entry phase using current or conventional HDL-based approaches is non-visual. Current HDL tools do not allow for visual design entry that can be found in common schematic entry tools such as AUTOCAD developed by Autodesk, Inc. of San Rafael, Calif. At block 120, behavior description is specified using HDL. Features of current HDL-based approaches allow various electrical aspects of the circuit behavior (e.g., rise and fall times of signals, delays through gates, functional operation, etc.) to be described by the designer. The resulting HDL simulation models can then be used as building blocks for larger circuits (e.g., using schematics, block diagrams or system-level HDL descriptions) for simulation purposes. When creating a behavioral description of a circuit, HDL generally allows the designer to describe the circuit in terms of its operation over time. At block 130, design simulation is performed. HDL provides the designer with the ability to simulate the circuit design. For example, executing HDL models (programs) result in discrete event simulations of the circuits (e.g., digital circuits) that are being designed. At block 140, structural description of the circuit is generated. HDL allows the designer to describe the circuit in terms of its components. Structure can be used to create a low-level description of a circuit (e.g., gate level or transistor-level description) or high-level description (e.g., block diagrams).

As mentioned above, current HDL design tools have several shortcomings. One of these shortcomings is that a hardware designer is required to learn not only HDL languages which are advanced high order programming languages but also to understand other types of languages such as C, C++, or Java. This is because, in most VLSI ASIC applications, algorithms are typically developed in either C, C++, or Java initially before they are implemented in VLSI hardware. The syntax of most HDL languages is different that that of C, C++, or Java. In addition, HDL simulation are limited to discrete event simulation of digital logic which is too restrictive for a designer trying to build VLSI ASIC designs that contain mixed signal and analog components. Moreover, current HDL design tools are non-visual and have restricted portability to other platforms.

The present invention provides a method and system for effective and efficient hardware design and synthesis which alleviate the aforementioned shortcomings of HDL and provide more versatility to increase the productivity of hardware designers.

In one embodiment, the teachings of the present invention can be implemented using a Java-based heterogeneous modeling framework such as Ptolemy developed by the University of California at Berkeley, with the following enhancements:

1. A component library implementation of the IEEE 1164 Standard Logic functions and other logic functions with which typical hardware structural models can be built.
2. A component library implementation of the IEEE 1076.3 Numeric Standard.
3. All the library components are enhanced to support the IEEE1076.4 VITAL timing annotations and delay considerations.
4. A Java software package for the extraction of Structural Models from Behavioral models. This package when combined with the package that is identified in item 6 constitutes a VLSI Hardware Synthesis from Behavioral Models.
5. A Java software package to analyze and extract the model timing and delay attributes. This is usually needed to support preparation and testing of the Synthesized Model for Physical Layout.
6. A Java software package to extract an EDIF Netlist from the tested Hardware Structural models. This is usually used as an input to the Physical Layout generation software.

Figure 2:
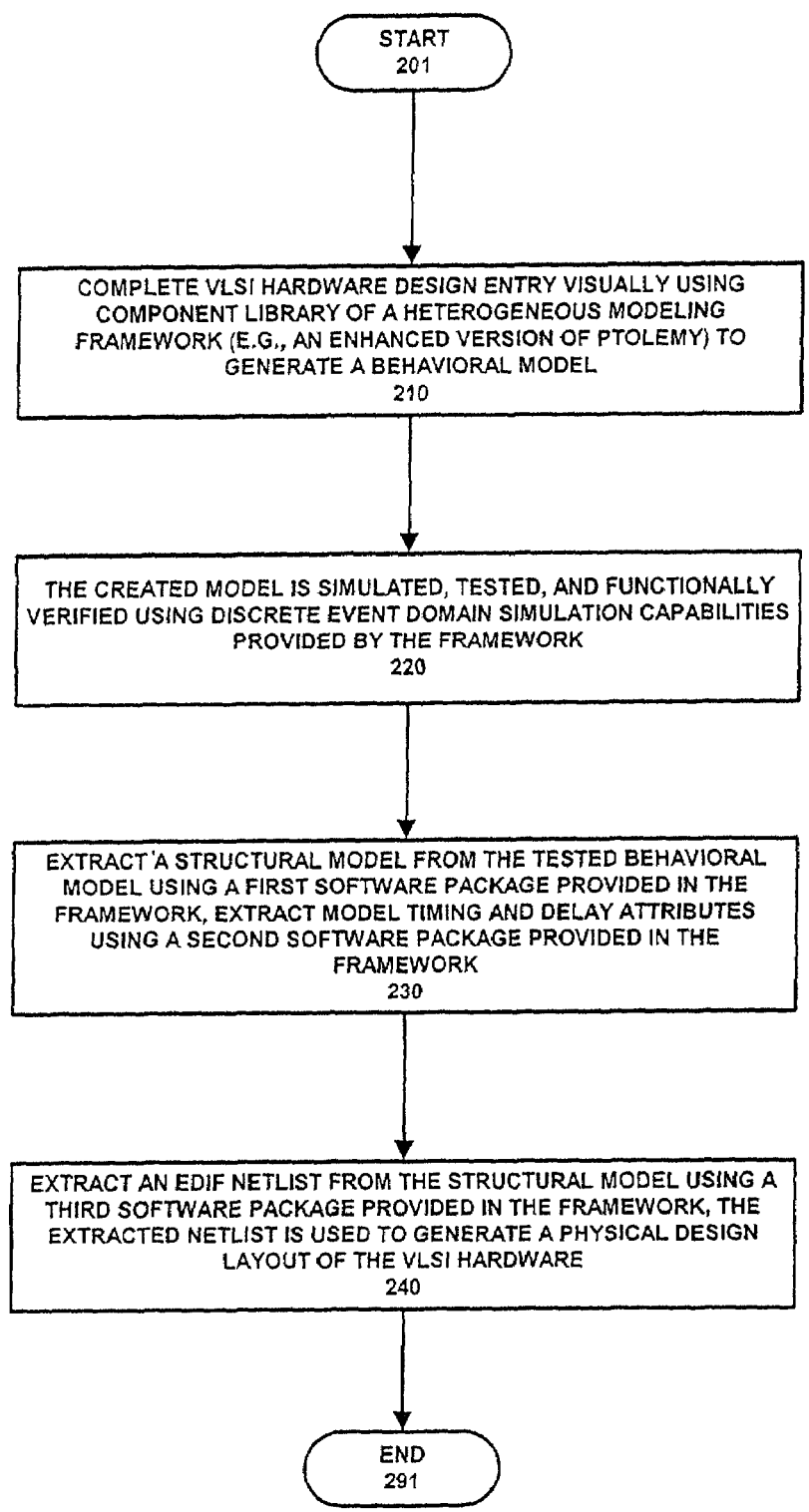
FIG. 2 shows an exemplary process for hardware design and synthesis in accordance with one embodiment of the present invention.

FIG. 2 illustrates an exemplary process for hardware design and synthesis in accordance with one embodiment of the present invention. In this embodiment, using the enhanced Ptolemy framework as described above, VLSI Hardware Design and Synthesis can be accomplished as follows:

Design Entry (at block 210): VLSI Hardware design entry can be completed visually using existing Ptolemy component library supported by the enhancements described in items 1 through 3 above. The VLSI model is built by interconnecting Ptolemy components using the GUI (Graphical User Interface) features of Ptolemy. This phase or step in the process does not require that the designer be knowledgeable of the Java language programming with which the components are described within Ptolemy. Accordingly, this alleviates the burden that would be imposed by the HDL requiring that the hardware designer be familiar with a programming language. This phase or step is very similar to using any of the available schematic entry packages to create a schematic for the design. Furthermore, because of the versatility provided by the multi-domain features of the Ptolemy framework, the model can contain mixed signal and analog components.

Model Testing and Verification (at block 220): in this phase of the process, the created model can be simulated, tested and functionally verified using the Discrete Event Domain Simulation Capabilities provided by the Ptolemy Framework. If the model contains any mixed signal or analog components, it can still be tested using the multi-domain capabilities provided by Ptolemy framework which allows for mixing Continuous Domain simulations of Analog and Mixed Signal components with Discrete Event Simulations of Digital Logic.

Structural Model Extraction (at block 230) Using the enhancement described in item 4 above, a structural model can be extracted from the tested behavioral model in this phase of the process. In one embodiment, the extracted model uses the components from the enhancements libraries (IEEE 1164 and 1076.3) described in items 1 and 2 above. Furthermore, using the enhancement described in item 5 above, the model timing can be extracted and fully analyzed as a prelude to Synthesis and Physical Design.

Synthesis (at block 240): Using the enhancement tool described in item 6 above, an EDIF netlist can be extracted from the structural model. This netlist is used to feed any of the currently available synthesizer software to generate a physical design layout of the VLSI Hardware.

As described above, the new design approach in accordance with one embodiment of the present invention alleviates the aforementioned shortcomings of HDL-based VLSI hardware design and synthesis as follows:

Visual design entry is similar to schematic capture.

The hardware designer need not be knowledgeable in any programming language.

Mixed signal and Analog models can be mixed within the model being designed.

The proposed approach is platform independent because Ptolemy and the enhancements according to the teaching of the present invention are Java-based.

Because Ptolemy can be operated within a distributed computing environment, the models generated using this approach can be tested within a distributed computing environment that is readily available, thus alleviating the need for special purpose expensive hardware accelerators.

In one embodiment, the new design approach as described above can accommodate other VLSI hardware designs that have been completed using Hardware Design Languages, such as VHDL or VERILOG. In one embodiment, the accommodation of the completed hardware designs can be achieved through additional software enhancements that translate the VHDL or VERILOG designs into Java-based simulations using the enhanced Ptolemy capabilities.

The following table shows a comparison between an HDL-based approach and this approach.

| Capability Description | HDL-Based Approach | Java-Based Enhanced Ptolemy Approach |
|---|---|---|
| Visual Design Entry and capture | No | Yes |
| Designer need not be experienced with the HDL programming language | No | Yes |
| Mixed signal and Analog components can be combined in the same model | No | Yes |
| Platform independence | No | Yes |
| Model can be operated in a readily available distributed environment | No | Yes |

Figure 3:
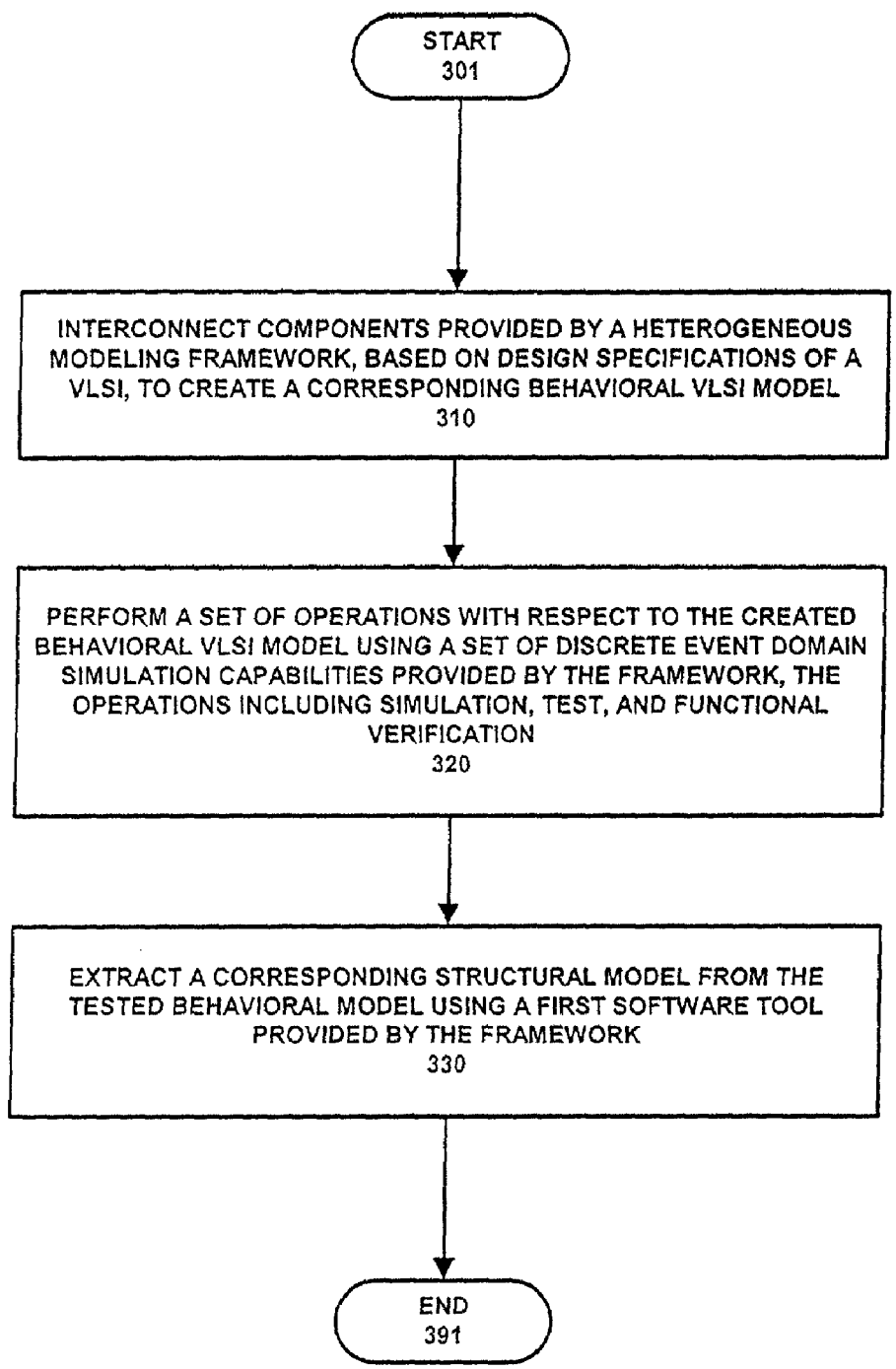
FIG. 3 illustrates a flow diagram of one embodiment of a method according to the teachings of the present invention.

FIG. 3 shows a flow diagram of one embodiment of a method according to the teachings of the present invention. At block 310, components provided by a heterogeneous modeling framework are interconnected, based on design specifications of a VLSI, to create a corresponding behavioral VLSI model. In one embodiment, the heterogeneous modeling framework contains a first component library including logic functions that can be used to build hardware structural models and a second component library including numeric standard. At block 320, a set of operations is performed with respect to the created behavioral VLSI model using a set of discrete event domain simulation capabilities provided by the heterogeneous framework. The operations performed include simulation, test, and functional verification operations. At block 330, a corresponding VLSI structural model is extracted from the tested behavioral VLSI model using a first software tool provided by the heterogeneous modeling framework.

It should be noted that the functional components illustrated in the above-referenced figures and discussed above could be implemented in hardware or software. If the aforementioned functional components are implemented in software, these components can be stored on a computer-readable medium, such as floppy disk, hard drive, CD-ROM, DVD, tape, memory, or any storage device that is accessible by a computer.

While certain exemplary embodiments have been described and shown in accompanying drawings, it is to be understood that such embodiments are merely illustrative of and not restrictive on the broad invention, and that the invention not be limited to the specific constructions and arrangements shown and described, since various other modifications may occur to those ordinarily skilled in the art.

What is claimed is:

1. A method for visual VLSI hardware design and synthesis, comprising:
    interconnecting components provided by a heterogeneous modeling framework, based on design specifications of a VLSI, to create a corresponding behavioral VLSI model, the heterogeneous modeling framework containing a first component library including logic functions that can be used to build hardware structural models and a second component library including numeric standard;
    performing a set of operations with respect to the created behavioral VLSI model using a set of discrete event domain simulation capabilities provided by the heterogeneous framework, the set of operations including simulation, test, and functional verification operations; and
    extracting a corresponding VLSI structural model from the tested behavioral VLSI model using a first software tool provided by the heterogeneous modeling framework.

2. The method of claim 1 further including:
    extracting model timing and delay attributes from the structure model using a second software tool provided by the heterogeneous modeling framework.

3. The method of claim 1 further including:
    extracting an EDIF netlist from the corresponding VLSI structural model using a third software tool provided by the heterogeneous modeling framework.

4. The method of claim 3 wherein the extracted EDIF netlist is used to generate a physical design layout of the corresponding VLSI hardware structure.

5. The method of claim 4 wherein the EDIF netlist is provided to a synthesizer software to generate the physical design layout of the corresponding VLSI hardware structure.

6. The method of claim 1 wherein the heterogeneous modeling framework is Java-based.

7. The method of claim 1 wherein the heterogeneous modeling framework is based on an enhanced version of the Ptolemy modeling framework.

8. The method of claim 1 wherein the first component library includes an implementation of IEEE 1164 standard logic functions.

9. The method of claim 1 wherein the second component library includes an implementation of IEEE 1076.3 numeric standard.

10. The method of claim 1 wherein the first and second component libraries are enhanced to support IEEE 1076.4 vital timing annotations and delay considerations.

11. A system comprising:
    a first component library including logic functions that are used to build hardware structural models;
    a second component library including numeric standards; and
    a set of software packages configured to create and test a behavioral VLSI model by interconnecting components provided by the first and second component libraries and using a set of discrete event domain simulation capabilities provided by the system, and to extract a corresponding structural VLSI model from the tested VLSI behavioral model.

12. The system of claim 11 wherein the set of software packages is configured to extract the model timing and delay attributes.

13. The system of claim 11 wherein a physical design layout is generated based on the extracted structural VLSI model.

14. The system of claim 13 wherein the set of software packages is configured to extract an EDIF netlist from the structural VLSI model and wherein the EDIF netlist is used by a synthesizer to generate the physical design layout of the VLSI hardware structure.

15. The system of claim 14 wherein the set of software packages includes:
a first object-oriented-based software package configured to extract structural models from behavioral models.

16. The system of claim 15 wherein the set of software packages further includes:
a second object-oriented-based software package configured to analyze and extract model timing and delay attributes.

17. The system of claim 16 wherein the set of software packages further includes:
a third object-oriented-based software package configured to extract EDIF Netlist from structural models.

18. The system of claim 17 wherein the first, second, and third software packages include Java-based software modules.

19. The system of claim 11 including a heterogeneous modeling framework in which the first component library, second component library, and the set of software packages are implemented.

20. The system of claim 19 wherein the heterogeneous modeling framework is based on an enhanced version of the Ptolemy modeling framework.

21. The system of claim 11 wherein the first component library includes an implementation of IEEE 1164 standard logic functions.

22. The system of claim 11 wherein the second component library includes an implementation of IEEE 1076.3 numeric standard.

23. The system of claim 22 wherein the first and second component libraries are enhanced to support IEEE 1076.4 vital timing annotations and delay considerations.

24. A machine-readable medium comprising instructions which, when executed by a machine, cause the machine to perform operations including:
interconnecting components provided by a heterogeneous modeling framework, based on design specifications of a VLSI, to create a corresponding behavioral VLSI model, the heterogeneous modeling framework containing a first component library including logic functions that can be used to build hardware structural models and a second component library including numeric standard;
performing a set of operations with respect to the created behavioral VLSI model using a set of discrete event domain simulation capabilities provided by the heterogeneous framework, the set of operations including simulation, test, and functional verification operations; and
extracting a corresponding VLSI structural model from the tested behavioral VLSI model using a first software tool provided by the heterogeneous modeling framework.

25. The machine-readable medium of claim 24 further including:
extracting model timing and delay attributes from the structure model using a second software tool provided by the heterogeneous modeling framework.

26. The machine-readable medium of claim 24 further including:
extracting an EDIF netlist from the corresponding VLSI structural model using a third software tool provided by the heterogeneous modeling framework.

27. The machine-readable medium of claim 26 wherein the extracted EDIF netlist is used to generate a physical design layout of the corresponding VLSI hardware structure.

28. The machine-readable medium of claim 27 wherein the EDIF netlist is provided to a synthesizer software to generate the physical design layout of the corresponding VLSI hardware structure.

29. The machine-readable medium of claim 24 wherein the heterogeneous modeling framework is Java-based.

30. The machine-readable medium of claim 24 wherein the heterogeneous modeling framework is based on an enhanced version of the Ptolemy modeling framework.

31. The machine-readable medium of claim 24 wherein the first component library includes an implementation of IEEE 1164 standard logic functions.

32. The machine-readable medium of claim 24 wherein the second component library includes an implementation of IEEE 1076.3 numeric standard.

33. The machine-readable medium of claim 24 wherein the first and second component libraries are enhanced to support IEEE 1076.4 vital timing annotations and delay considerations.

* * * * *